United States Patent
Dunn et al.

[19]

[11] Patent Number: 6,103,134
[45] Date of Patent: Aug. 15, 2000

[54] CIRCUIT BOARD FEATURES WITH REDUCED PARASITIC CAPACITANCE AND METHOD THEREFOR

[75] Inventors: Gregory J. Dunn, Arlington Heights; Larry Lach, Chicago; Jovica Savic; Allyson Beuhler, both of Downers Grove; Everett Simons, Palatine, all of Ill.

[73] Assignee: Motorola, Inc., Schaumburg, Ill.

[21] Appl. No.: 09/224,011

[22] Filed: Dec. 31, 1998

[51] Int. Cl.[7] ................................................. H05K 3/06
[52] U.S. Cl. ........................... 216/17; 216/19; 430/313; 430/314; 430/318
[58] Field of Search ..................... 216/17, 19; 430/313, 430/314, 318; 29/846; 174/250, 257, 261, 268

[56] References Cited

U.S. PATENT DOCUMENTS

| | | | |
|---|---|---|---|
| 4,899,439 | 2/1990 | Potter et al. | 29/846 |
| 5,281,769 | 1/1994 | Hirano et al. | 174/250 |
| 5,310,700 | 5/1994 | Lien et al. | 437/195 |
| 5,370,766 | 12/1994 | Desaigoudar et al. | 156/643 |
| 5,709,979 | 1/1998 | Casson et al. | 430/311 |
| 5,747,870 | 5/1998 | Pedder | 257/531 |
| 5,806,177 | 9/1998 | Hosomi et al. | 29/846 |
| 6,008,102 | 12/1999 | Alford et al. | 438/381 |
| 6,035,530 | 3/2000 | Hong | 29/885 |

FOREIGN PATENT DOCUMENTS

| | | |
|---|---|---|
| 570094 A2 | 11/1993 | European Pat. Off. . |
| 0818228 | 1/1996 | Japan . |

Primary Examiner—Randy Gulakowski
Assistant Examiner—Anita Alanko
Attorney, Agent, or Firm—Douglas D. Fekete

[57] ABSTRACT

A method for fabricating circuit board conductors with desirable processing and reduced self and mutual capacitance. The method generally entails forming a metal layer on a positive-acting photodielectric layer formed on a substrate, and then etching the metal layer to form at least two conductor traces that cover two separate regions of the photodielectric layer while exposing a third region of the photodielectric layer between the two regions. The third region of the photodielectric layer is then irradiated and developed using the two traces as a photomask, so that the third region of the photodielectric layer is removed. The two remaining regions of the photodielectric layer masked by the traces remain on the substrate and are separated by an opening formed by the removal of the third dielectric region. As a result, the traces are not only separated by a void immediately therebetween formed when the metal layer was etched, but are also separated by the opening formed in the photodielectric layer by the removal of the third region of the photodielectric layer. Traces formed in accordance with the above may be formed as adjacent and parallel conductors or adjacent inductor windings of an integral inductor.

14 Claims, 2 Drawing Sheets

6,103,134

1

CIRCUIT BOARD FEATURES WITH REDUCED PARASITIC CAPACITANCE AND METHOD THEREFOR

This invention was made with Government support under Agreement No. F33615-96-2-1838 awarded by DARPA. The Government has certain rights in the invention.

BACKGROUND OF THE INVENTION

1. Field of the Invention

The present invention generally relates to electrical circuits and their fabrication. More particularly, this invention relates to a process for fabricating circuit board conductors with reduced self and mutual capacitance per unit length, resulting in significantly reduced crosstalk and propagation delays for digital signal lines, and increased useful bandwidth for integral inductors.

2. Description of the Prior Art

As depicted in FIG. 1, multilayer printed circuit boards 10 typically have metal layers that are patterned to form conductors or traces 12 and 14, which may serve as digital signal lines or inductor windings of an integral inductor. Traces 12 and 14 of adjacent metal layers are separated by a dielectric layer 16 and may be electrically interconnected with a metallized via (not shown) through the dielectric layer 16. Traditional methods of patterning metal layers of a printed wiring board (PWB) require traces to be either buried within or resting on a planar dielectric layer, as traces 12 and 14, respectively, are depicted with respect to the dielectric layer 16. As a result, the dielectric layer 16 lies between the traces 12 and 14 and promotes self and mutual capacitances that are detrimental if the traces 12 and 14 are adjacent digital signal lines or inductor windings. In the case of digital signal lines, these capacitances create significant undesirable signal propagation delays and levels of crosstalk between adjacent lines. For integral inductors, parasitic capacitance between adjacent windings lowers the self resonance frequency of the inductor and hence reduces useful bandwidth.

Prior methods of minimizing parasitic capacitance between adjacent traces have involved either the use of costly, low-dielectric constant materials to form the dielectric layers between the traces, or the alteration of the line widths or spaces between the lines. The latter approach involves increasing the distance between adjacent lines and/or decreasing the line widths, with a disadvantage of the first being that additional layout area is required and a disadvantage of the second being objectionably narrow lines that produce additional electrical loss and greater sensitivity to process variations.

Accordingly, it would be desirable if a method were available for fabricating circuit board conductors and traces with reduced self and mutual capacitance per unit length, with the result that crosstalk and propagation delays are significantly reduced for digital signal lines, and useful bandwidth is significantly increased for integral inductors.

SUMMARY OF THE INVENTION

According to the present invention, there is provided a method for fabricating circuit board conductors with desirable processing and performance characteristics. The method generally entails forming a metal layer on a positive-acting photodielectric layer, preferably a thermally-curable photoresist material, formed on a substrate, and then etching

2 the metal layer to form at least two conductor portions that cover two separate regions of the photodielectric layer while exposing a third region of the photodielectric layer between the two regions. The third region of the photodielectric layer is then irradiated and developed using the two conductor portions as a photomask, so that the third region of the photodielectric layer is removed. As a result, the two remaining regions of the photodielectric layer masked by the conductor portions remain on the substrate and are separated by an opening formed by the removal of the third dielectric region.

The two conductor portions formed by the above process yield a pair of conductor traces that may be patterned as adjacent and parallel conductors or adjacent inductor windings of an integral inductor. Importantly, the traces are not only separated by a void immediately therebetween formed when the metal layer was etched, but are also separated by the opening formed in the photodielectric layer by the removal of the third region of the photodielectric layer. Accordingly, the process of this invention yields circuit board traces that are separated by a void (i.e., air) instead of the dielectric material 16 shown in FIG. 1. Because air has a dielectric constant of one as compared to about three to four for typical polymer dielectrics, parasitic capacitance between the conductor portions is greatly reduced without reducing mutual magnetic coupling. Therefore, the resonance frequency and useful bandwidth of an inductor incorporating the conductor portions as windings are increased without reducing inductance or increasing layout area. The absence of dielectric material (generally high loss) between windings may also contribute to a higher inductor Q value for the inductor. If the traces are used as digital signal lines, the absence of dielectric material between the conductor portions reduces crosstalk and improves digital signal quality, as well as reduces self capacitance of the lines to minimize propagation delay for a given line width.

Alternatively, if the traces are inductor windings, a ferrite-filled polymer may be deposited in the void between the traces in order to increase the inductance and Q value of the inductor. The initial presence of the void between the windings allows a greater volume of ferrite-filled polymer to be placed in closer proximity to the inductor windings, significantly enhancing the effect of the ferrite on inductor performance.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which.

DETAILED DESCRIPTION OF THE PREFERRED EMBODIMENT

Figure 1:
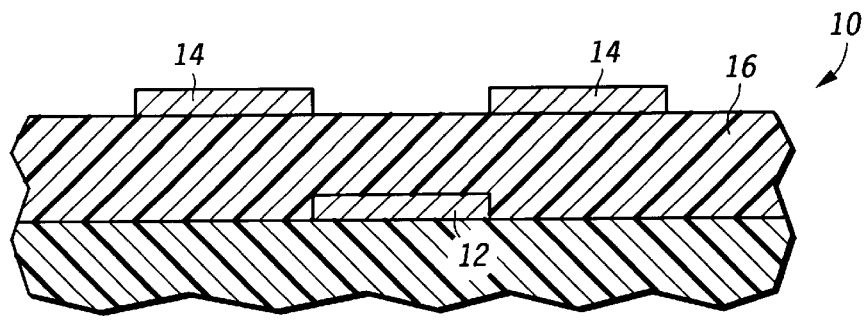
FIG. 1 is a cross-sectional view of a multilayer circuit board having two metal layers that are patterned to form traces in accordance with the prior art.

A portion of a circuit board processed to have one or more pairs of metal traces in accordance with this invention is represented in FIGS. 2 through 11. The invention encompasses forming a pair of metal traces 24A and 24B that can serve as either digital signal lines or windings of an integral inductor, with additional pairs of metal traces (e.g., 40A and 40B of FIG. 11) being possible. In contrast to the prior art of FIG. 1 in which pairs of traces 12 and 14 are separated but capacitively coupled through a dielectric layer 16, each pair of traces 24A–B and 40A–B of this invention is separated by a void (e.g., air) or optionally a ferrite material 34, with the result that improved electrical performance is attained.

Figure 2:
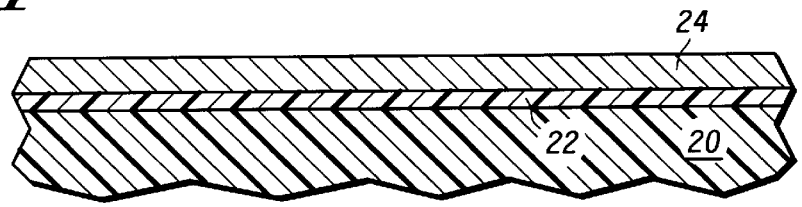
FIGS. 2 through 11 are cross-sectional views showing process steps for forming traces of a multilayer circuit board in accordance with a preferred embodiment of this invention.

As shown in FIG. 2, the process of this invention begins with the deposition on a substrate 20 of a dielectric layer 22, followed by a metal layer 24. The substrate 20 can be any suitable material, including a printed wiring board (PWB), a flexible circuit, a ceramic or silicon substrate, or another dielectric layer of a multilayer circuit, though other suitable substrates and materials could also be used. Because the electrically conductive traces 24A and 24B are to be formed from the metal layer 24, the layer 24 is preferably a copper foil laminated to the dielectric layer 22, though it is foreseeable that the metal layer 24 could be formed by different methods and with different materials. A suitable thickness for the metal layer 24 is about five to about fifty micrometers. A suitable copper foil can be laminated to the dielectric layer 22 by applying a pressure of about 230 psi (about 1.6 MPa) for about twenty minutes at a temperature of about 65 C.

The dielectric layer 22 is preferably formed of a positive-acting thermally-curable photoresist material, such that known photoimaging and development techniques can be employed to pattern the dielectric layer 22. Suitable thick-film polymer compositions typically include a resin, photosensitive agents and hardeners. The resin component can be any suitable liquid resin or solid resin, so as to enable the resin mixture to be readily deposited onto the surface of the substrate 20 in liquid form or as a laminate to form the dielectric layer 22. Resins that could be used include thermoplastic resins, thermosetting resins, elastomers and mixtures thereof, which when incorporated with a photosensitive material yield a photoimageable composition. Desirable properties for the thick-film polymer include physical properties that remain stable throughout deposition and photoimaging of the dielectric layer 22. According to this invention, the dielectric layer 22 serves as a permanent dielectric layer of the circuit structure on the substrate 20, such that the dielectric properties of the thick-film polymer also preferably remain stable throughout the deposition and photoimaging processes. For the above reasons, epoxies are particularly suitable as the resin for the dielectric layer 22, with a preferred liquid epoxy-base composition being commercially available from Ciba-Geigy under the name PROBELEC®. As a liquid resin, PROBELEC is dried before application of the metal layer 24, with a suitable drying step being about thirty minutes at about 100 C. Due to the presence of photosensitive agents, exposure of the dried dielectric layer 22 to appropriate electromagnetic radiation can be performed through a mask to precisely photochemically pattern the dielectric layer 22. Regions of the dielectric layer 22 exposed to electromagnetic radiation become relatively soluble to certain developers, while unexposed regions of the partially-cured dielectric layer 22 remain relatively insoluble.

Figure 3:
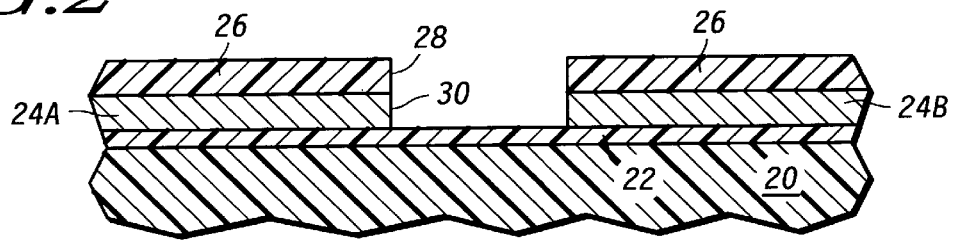
Figure 4:
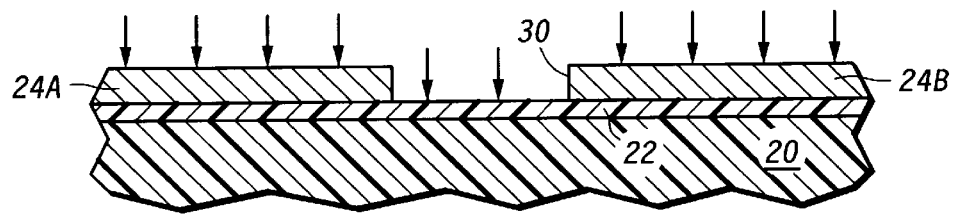
Figure 5:
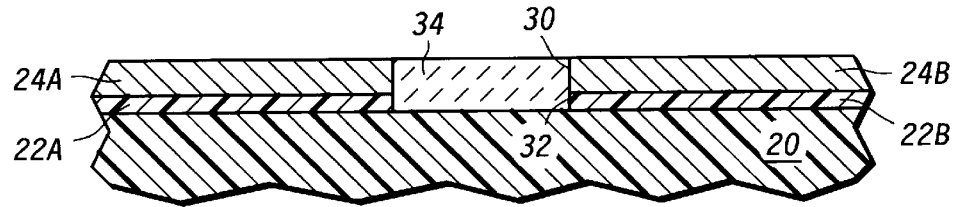

As shown in FIG. 3, a mask 26 has been patterned over the metal layer 24, and a portion of the metal layer 24 exposed through an opening 28 in the mask 26 has been removed by etching to form the two traces 24A and 24B. A suitable material for the mask 26 is polymer photoresist, and a suitable etchant is cupric chloride or ammonium hydroxide if the metal layer 24 is copper. The traces 24A and 24B cover two regions of the dielectric layer 22 and expose through an opening 30 therebetween a third region of the dielectric layer 22. In FIG. 4, the exposed region of the dielectric layer 22 is electromagnetically irradiated in a known manner, with the two traces 24A and 24B serving as a photomask to yield a relatively more soluble state in the exposed region of the dielectric layer 22. After partially curing, or "heat bumping," the dielectric layer 22, for example, at about 100 C to 120 C for about ten to sixty minutes, the exposed region of the dielectric layer 22 is removed by a suitable developer, e.g., gamma butylactone (GBL) if PROBELEC is used as the material for the dielectric layer 22. As a result of remaining unirradiated and therefore polymerized and relatively insoluble to the developer, the two regions 22A and 22B of the dielectric layer 22 beneath the traces 24A and 24B remain on the substrate 20 and are separated by an opening 32 therebetween formed by the removal of the exposed third region of the dielectric layer 22, as shown in FIG. 5. Thereafter, the two regions 22A and 22B of the dielectric layer 22 can be fully cured, e.g., about two hours at about 150 C if the dielectric layer 22 was formed of the PROBELEC resin.

FIG. 5 shows a ferrite core 34 formed by depositing a ferrite-containing material, such as a ferrite-filled polymer, in the openings 30 and 32 in the metal and dielectric layers 24 and 22, respectively. As known in the art, if the traces 24A and 24B are windings of an integral inductor, the ferrite core 34 is useful for increasing inductance and the Q value of the inductor. However, it should be understood that the ferrite core 34 is optional, and is preferably altogether omitted if the traces 24A and 24B are adjacent digital signal lines. If the ferrite core 34 is omitted, the traces 24A and 24B are separated by a void formed by the openings 30 and 32 between the traces 24A and 24B and the dielectric regions 22A and 22B, respectively. The void (air) considerably reduces the self and mutual capacitance per unit length of the traces 22A and 22B, thereby improving the electrical performance of traces 22A and 22B, whether they serve as digital signal lines or inductor windings.

Figure 6:
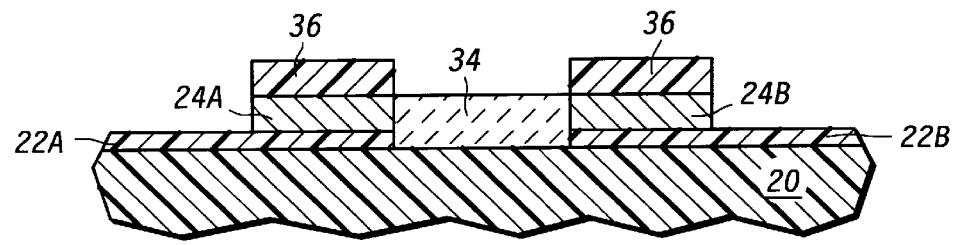
Figure 7:
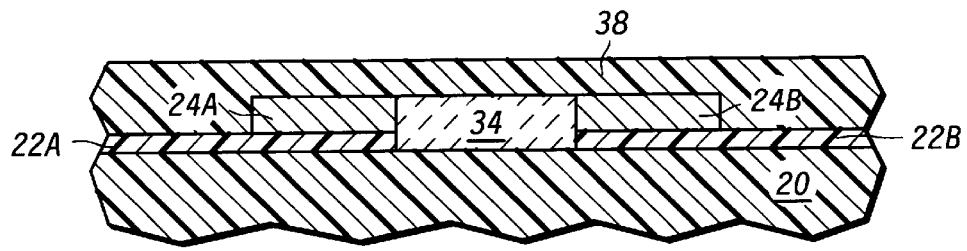
Figure 8:
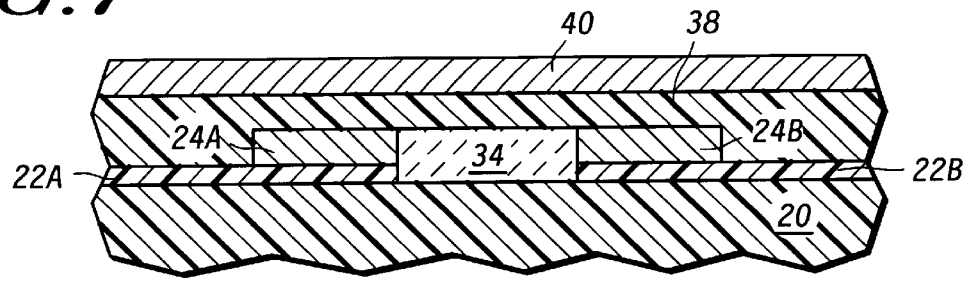
Figure 9:
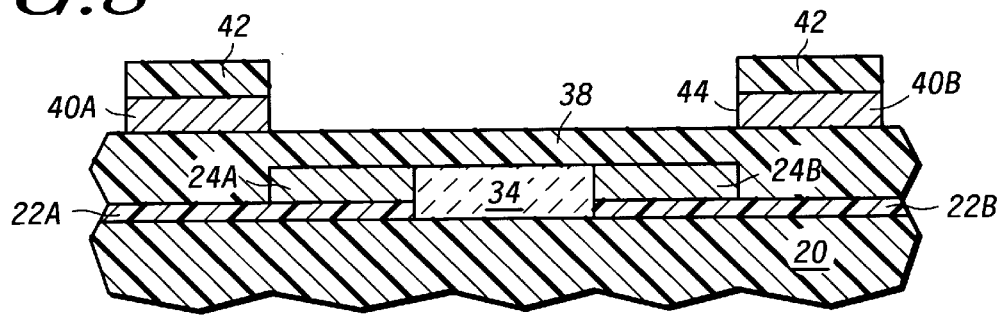
Figure 10:
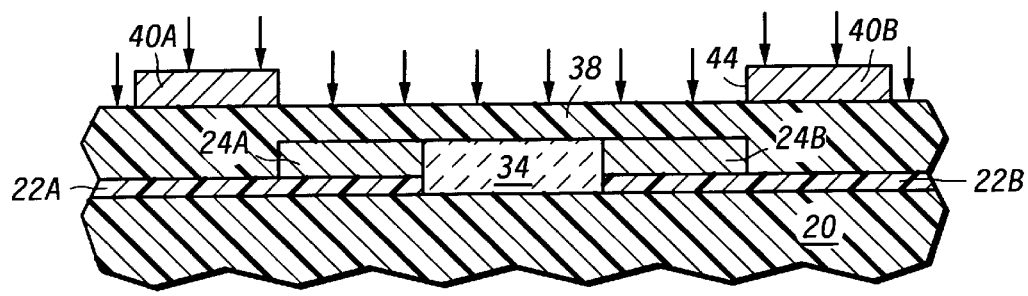

FIGS. 2 through 5 yield the single pair of traces 24A and 24B of a single metal layer 24 as shown. As part of a multilayer circuit board, additional layers are within the scope of this invention, as illustrated in FIGS. 6 through 11. In FIG. 6, the metal traces 24A and 24B have been etched for a second time through a mask 36, with the result that a portion of each region 22A and 22B of the dielectric layer 22 is exposed. In FIG. 7, a second dielectric layer 38 of a positive-acting photodielectric material has been deposited over the exposed portions of the regions 22A and 22B, the traces 24A and 24B, and the ferrite core 34. As with the first dielectric layer 22, a second metal layer 40, e.g., a copper foil laminate, is applied as shown in FIG. 8. Similar to before, this metal layer 40 is also etched through a second patterned mask 42 to yield the two metal traces 40A and 40B shown in FIG. 9. The traces 40A and 40B define an opening 44 through which a portion of the dielectric layer 38 is exposed. The exposed region of the dielectric layer 38 is then electromagnetically irradiated as shown in FIG. 10, with the two traces 40A and 40B serving as a photomask to yield a relatively more soluble state in the exposed region of the dielectric layer 38, after which the exposed region is removed by a suitable developer.

Figure 11:
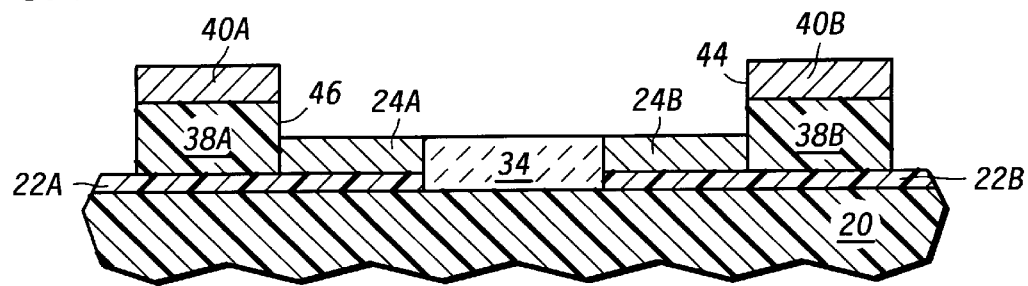

After developing the dielectric layer 38, the traces 40A and 40B are separated by a void formed by the opening 44 between the traces 40A and 40B and an opening 46 between the remaining regions 38A and 38B of the dielectric layer 38, as shown in FIG. 11. As before, this void (air) considerably reduces the self and mutual capacitance per unit length of the traces 40A and 40B, thereby improving their electrical performance in their role as either digital signal lines or inductor windings. Because they are exposed, the traces 24A–B and 40A–B may require protection from subsequent processing; for example, a sacrificial photoresist may be applied to the traces 24A–B and 40A–B to prevent their exposure to catalysts used in preparation for certain plating processes, such as plating of vias between metal layers of the multilayer circuit board structure.

While the invention has been described in terms of particular embodiments, it is apparent that other forms could be adopted by one skilled in the art. For example, the configurations of the individual circuit board structures could vary considerably from those shown in the Figures, and materials other than those noted could be used. Accordingly, the scope of the invention is to be limited only by the following claims.

What is claimed is:

1. A method of manufacturing a circuit board having conductors, the method comprising the steps of:

forming a positive-acting photodielectric layer on a substrate;

applying a conductive foil to the photodielectric layer;

etching the conductive foil to form at least two conductor portions that cover first and second regions of the photodielectric layer and expose a third region of the photodielectric layer between the first and second regions; and then irradiating and developing the third region of the photodielectric layer using the two conductor portions as a photomask, so that the third region of the photodielectric layer is removed and the first and second regions of the photodielectric layer remain on the substrate and are separated by a void therebetween.

2. The method according to claim 1, wherein the step of applying the conductive foil to the photodielectric layer comprises a laminating technique.

3. The method according to claim 1, wherein the conductive foil comprises copper or an alloy thereof.

4. The method according to claim 1, wherein the two conductive portions formed by the etching step are two adjacent and parallel conductors.

5. The method according to claim 1, wherein the two conductive portions formed by the etching step are two adjacent inductor windings of an integral inductor.

6. The method according to claim 1, further comprising the step of depositing a ferrite-filled polymer in the void and between the two conductor portions.

7. The method according to claim 1, wherein the photodielectric layer is formed of a positive-acting thermally-curable photoresist material.

8. The method according to claim 1, wherein the step of irradiating and developing the third region of the photodielectric layer is accomplished by exposing the third region to electromagnetic radiation at a frequency, a propagational direction and an intensity sufficient to activate photosensitive characteristics of the photodielectric layer thereby yielding a relatively more soluble state in the third region than in each of the first and second regions, and then etching the third region to expose an underlying portion of the substrate.

9. The method according to claim 1, further comprising the steps of:

etching the two conductor portions that cover the first and second regions of the photodielectric layer to expose fourth and fifth regions of the photodielectric layer that are adjacent but not between the first and second regions, respectively;

forming a second positive-acting photodielectric layer on the fourth and fifth regions;

applying a second conductive foil to the second photodielectric layer;

etching the second conductive foil to form at least two additional conductor portions that cover regions of the second photodielectric layer on the fourth and fifth regions of the photodielectric layer and expose remaining regions of the second photodielectric layer; and then irradiating and developing the remaining regions of the second photodielectric layer using the two additional conductor portions as a photomask so that the two additional conductor portions are separated by a void therebetween.

10. A method of manufacturing a circuit board having conductors, the method comprising the steps of:

applying a positive-acting epoxy-base photodielectric material to a substrate to form a photodielectric layer capable of a soluble state and an insoluble state;

laminating a copper foil to the photodielectric layer;

etching the copper foil to form at least two conductor portions that cover first and second regions of the photodielectric layer and expose a third region of the photodielectric layer between the first and second regions;

electromagnetically irradiating the third region of the photodielectric layer using the two conductor portions as a photomask to yield a relatively more soluble state in the third region of the photodielectric layer than in the first and second regions of the photodielectric layer; and then treating the third region of the photodielectric layer to a developer to remove the third region and leave the first and second regions of the photodielectric layer on the substrate and separated by a void therebetween.

11. The method according to claim 10, wherein the two conductive portions formed by the etching step are two adjacent and parallel conductors.

12. The method according to claim 10, wherein the two conductive portions formed by the etching step are two adjacent inductor windings of an integral inductor.

13. The method according to claim 10, further comprising the step of depositing a ferrite-filled polymer in the void and between the two conductor portions.

14. The method according to claim 10, further comprising the steps of:

etching the two conductor portions that cover the first and second regions of the photodielectric layer to expose fourth and fifth regions of the photodielectric layer that are adjacent but not between the first and second regions, respectively;

applying a positive-acting photodielectric material over the fourth and fifth regions and remaining portions of the two conductor portions to form a second photodielectric layer capable of a soluble state and an insoluble state;

applying a second conductive foil to the second photodielectric layer;

etching the second conductive foil to form at least two additional conductor portions that cover regions of the second photodielectric layer on the fourth and fifth regions of the photodielectric layer and that expose remaining regions of the second photodielectric layer; and then electromagnetically irradiating and developing the remaining regions of the second photodielectric layer using the two additional conductor portions as a photomask so that the two additional conductor portions are separated by a void therebetween.

\* \* \* \* \*